United States Patent
Yang et al.

(10) Patent No.: US 11,164,779 B2
(45) Date of Patent: Nov. 2, 2021

(54) BAMBOO TALL VIA INTERCONNECT STRUCTURES

(71) Applicant: International Business Machines Corporation, Armonk, NY (US)

(72) Inventors: Chih-Chao Yang, Glenmont, NY (US); Michael Rizzolo, Delmar, NY (US); Theodorus E. Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 127 days.

(21) Appl. No.: 16/382,363

(22) Filed: Apr. 12, 2019

(65) Prior Publication Data

US 2020/0328112 A1 Oct. 15, 2020

(51) Int. Cl.
| | |
|---|---|
| *H01L 21/768* | (2006.01) |
| *H01L 23/532* | (2006.01) |
| *H01L 23/522* | (2006.01) |

(52) U.S. Cl.
CPC .... *H01L 21/76849* (2013.01); *H01L 21/7684* (2013.01); *H01L 21/76802* (2013.01); *H01L 23/5226* (2013.01); *H01L 23/53209* (2013.01); *H01L 23/53223* (2013.01); *H01L 23/53238* (2013.01); *H01L 23/53266* (2013.01)

(58) Field of Classification Search
CPC ......... H01L 21/76802; H01L 21/76838; H01L 21/7684; H01L 21/76847; H01L 21/76849; H01L 21/76883; H01L 23/5226; H01L 23/53209; H01L 23/53223; H01L 23/53238; H01L 23/53266
See application file for complete search history.

(56) References Cited

U.S. PATENT DOCUMENTS

| | | | |
|---|---|---|---|
| 5,758,413 A | 6/1998 | Chong et al. | |
| 5,899,738 A | 5/1999 | Wu et al. | |
| 6,114,243 A * | 9/2000 | Gupta | H01L 21/7684 257/E21.583 |
| 8,546,919 B2 | 10/2013 | Pratt | |
| 8,552,570 B2 | 10/2013 | Kikuchi et al. | |

(Continued)

FOREIGN PATENT DOCUMENTS

WO 199938210 A1 7/1999

*Primary Examiner* — Eric A. Ward
*Assistant Examiner* — Dmitriy Yemelyanov
(74) *Attorney, Agent, or Firm* — Cantor Colburn LLP; L. Jeffrey Kelly

(57) ABSTRACT

Semiconductor devices including bamboo tall via interconnect structures and methods of forming the bamboo tall via interconnect structures generally include a first via in a first dielectric layer including a liner layer and a bulk conductor in the first via, wherein the bulk conductor includes a recess filled with a conductive metal different from the bulk conductor and selected to prevent diffusion of the bulk conductor. At least one additional via is in a second dielectric layer including a liner layer and a bulk conductor in the least one additional via, wherein the second dielectric layer is on the first dielectric layer, and wherein the bulk conductor includes a recess filled with a conductive metal different from the bulk conductor and selected to prevent diffusion of the bulk conductor. The at least one additional via is aligned with the first via.

6 Claims, 6 Drawing Sheets

(56) References Cited

U.S. PATENT DOCUMENTS

| | | |
|---|---|---|
| 9,837,603 B1 | 12/2017 | Deshpande |
| 9,917,048 B2 | 3/2018 | Chiu et al. |
| 9,985,075 B2 | 5/2018 | Chuang et al. |
| 10,109,526 B1* | 10/2018 | Zhang ............... H01L 21/76831 |
| 10,109,790 B2 | 10/2018 | Chuang et al. |
| 2004/0012056 A1 | 1/2004 | Nejad |
| 2010/0311243 A1 | 12/2010 | Mao |
| 2011/0237069 A1* | 9/2011 | Miyazaki .......... H01L 21/76816 |
| | | 438/653 |
| 2012/0032287 A1 | 2/2012 | Li et al. |
| 2013/0270703 A1* | 10/2013 | Zierath ............. H01L 21/76879 |
| | | 257/751 |
| 2014/0042567 A1 | 2/2014 | Jung |
| 2015/0123279 A1* | 5/2015 | Chi ................... H01L 23/53252 |
| | | 257/751 |
| 2015/0171314 A1 | 6/2015 | Li et al. |
| 2016/0064648 A1 | 3/2016 | Tsubata |
| 2016/0133828 A1 | 5/2016 | Lu et al. |
| 2017/0053967 A1 | 2/2017 | Chuang |
| 2017/0352804 A1 | 12/2017 | Chuang |
| 2018/0040814 A1 | 2/2018 | Park |

\* cited by examiner

BAMBOO TALL VIA INTERCONNECT STRUCTURES

BACKGROUND

This invention relates generally to interconnect structures for integrated circuits, and more specifically to fabrication methods and resulting structures for bamboo tall interconnect vias having relatively high aspect ratios such as for example skip vias formed between non-adjacent multilevel metallization layers in a semiconductor device or the like.

In fabricating semiconductor devices, multiple electrical connections are typically formed to each device, and millions of devices can be on a substrate. Openings filled with a conductive material are typically formed to connect the device connections to higher device levels for eventual connection to the electrical package contacts. With shrinking device sizes, the pitches between these electrical vias have also been shrinking.

Vias can typically be formed through dielectric layers, for example, interlayer dielectrics, to metallized layers and to components of the actual devices. The electrical connections between devices on the substrate and from the package contacts to the devices can be routed through the different metallized layers, which can act as wiring (e.g., channels). The multiple levels of interconnecting wiring are typically separated by the intervening dielectric layers through which the vias are formed. In typical integrated circuit packages, seven or more metallization levels could be involved. The layout of the electrical connections can therefore be incredibly complex. Multiple patterning techniques involving registered mask patterns can be used to form the different levels. Multiple cycles of masking and etching can be used. This is typically considered the back-end-of-line (BEOL) fabrication stage.

Common metals used for the interconnect wiring are copper interconnect and aluminum interconnect. BEOL generally begins when the first layer of metal is deposited on the wafer. BEOL includes contacts, insulating layers (dielectrics), metal levels, and bonding sites for chip-to-package connections.

SUMMARY

Embodiments of the present invention are generally directed to semiconductor devices and methods for forming bamboo tall via structures in a semiconductor device. A non-limiting example of the bamboo tall via interconnect structure in the semiconductor device includes a first via in a first dielectric layer. A liner layer and a bulk conductor is in the first via, wherein the bulk conductor includes a recess filled with a conductive metal different from the bulk conductor and selected to prevent diffusion of the bulk conductor. At least one additional via is in a second dielectric layer and includes a liner layer and a bulk conductor in the at least one additional via. The second dielectric layer is on the first dielectric layer and the bulk conductor in the second dielectric layer includes a recess filled with a conductive metal different from the bulk conductor and selected to prevent diffusion of the bulk conductor. The at least one additional via is aligned with the first via.

A non-limiting example of the bamboo tall via interconnect structure in accordance with one or more aspects of the present invention includes a contact pad or line in a first dielectric layer. At least one via is in a first interlayer dielectric. The at least one via is coupled to the contact pad or line in the first dielectric layer and includes a conductive liner layer on sidewalls and a bottom surface thereof, a bulk conductor including a recessed top surface, and a conductive metal in the recess and having a coplanar surface with the first interlayer dielectric. At least one additional via in a second interlayer dielectric is on the first dielectric layer. The at least one additional via includes a conductive liner layer on sidewalls and a bottom surface thereof, a bulk conductor including a recessed top surface, and a conductive metal in the recess and having a coplanar surface with the second interlayer dielectric, wherein the at least one additional via is electrically coupled to the first via through the conductive metal in the recess therein. A memory stack or a conductive pad or a conductive line electrically coupled to the conductive metal in the recess of the at least one additional via.

A non-limiting example of a process for forming a bamboo tall via interconnect structure in accordance with one or more other aspects of the present invention includes forming a first node, which includes forming at least one via opening in a first dielectric layer overlying a substrate to expose a surface of an underlying conductor, conformally depositing a liner layer, depositing a bulk conductor into the at least one via opening, planarizing the substrate to form a recess in the bulk conductor within the at least one via opening, and depositing a conductive metal into the recess. At least one additional node is formed that is stackedly arranged and in alignment with the first node. Forming the at least one additional node includes forming at least one via opening in a second dielectric layer deposited onto the first node to expose the conductive metal in the recess, conformally depositing a liner layer, depositing a bulk conductor into the at least one via opening, planarizing the substrate to form a recess in the bulk conductor within the at least one via opening and depositing a conductive metal into the recess.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

Figure 1:
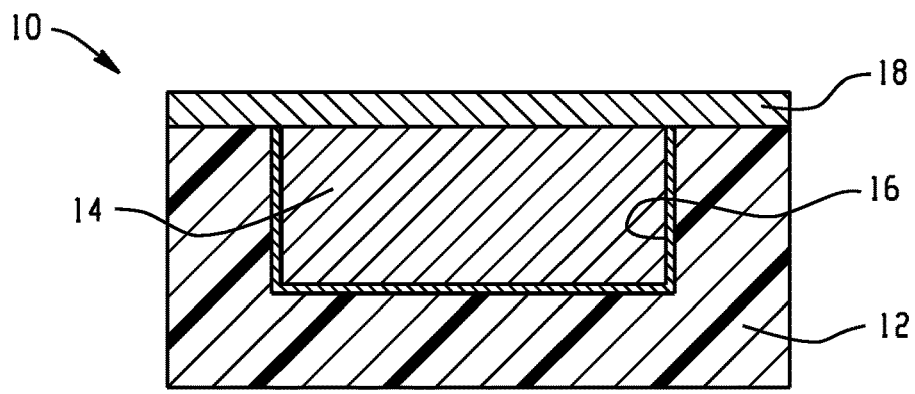
FIG. 1 is a schematic cross-sectional view depicting an initial semiconductor structure for forming a bamboo tall via interconnect structure including a planar insulating barrier layer overlying a conductor in accordance with one or more embodiments of the present invention.

It will be appreciated that for simplicity and clarity of illustration, elements shown in the drawings have not necessarily been drawn to scale. For example, the dimensions of some of the elements could be exaggerated relative to other elements for purpose of clarity.

DETAILED DESCRIPTION

The present invention is generally directed to fabrication of bamboo tall via interconnect structures and the resulting structures for use in a semiconductor device. Tall interconnect vias generally need a high aspect ratio making it challenging for fabricators to provide adequate liner layer coverage and metal fill quality. It is also a challenge to maintain mechanical strength supporting the tall via. In the present invention, fabrication methods are provided to form bamboo tall via interconnect structures, wherein the resulting bamboo tall via interconnect structures can be used at high aspect ratios and overcome the above noted problems associated with the prior art tall vias.

As used herein, the term "bamboo tall via interconnect structure" is generally defined by the cross-sectional presence of a bamboo-like structure including two or more nodes defined by metal filled recesses, wherein the internodal regions include a bulk conductor. Each internodal region is joined through a liner material and the metal filled recess to form the bamboo tall via interconnect structure.

As will be described in greater detail herein, the bamboo tall via interconnect structures in accordance with the present invention are void free, not limited to any specific aspect ratio, and are mechanically stable. Moreover, the bamboo tall via interconnect structure can be provided above or below a contact pad/line, under a memory stack, or the like, as can be desired for different applications. In one or more embodiments, the bamboo tall via interconnect structure can be utilized as a skip via, which provide interconnection between two metallization levels that are separated by at least one other metallization level, e.g., a skip via to connect Mx and Mx+2 interconnects, wherein a portion of the other metallization level ($M_x$+1) is in a pathway of the skip via. For example, the skip-via can connect a first metallization layer, M1, to a third metallization layer, M3.

Detailed embodiments of the integrated circuit including the bamboo tall via interconnect structure and methods for fabricating an integrated circuit including the bamboo tall via interconnect structure according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer can be formed by a first process (e.g., ALD, PEALD, etc.) and a fill can be formed by a second process (e.g., CVD, electrodeposition, PVD, etc.).

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, ULSI, etc.) application specific integrated circuits (ASICS) and processors.

It is to be understood that the present invention will be described in terms of a given illustrative architecture; however, other architectures, structures, substrate materials and process features and steps can be varied within the scope of the present invention.

Referring now to the drawings in which like numerals represent the same or similar elements and initially to FIG. 1, a semiconductor device 10 including a dielectric layer 12, a conductor 14, and a liner layer 16 (i.e., a diffusion barrier layer to prevent diffusion of the conductor into the dielectric material 12) intermediate the conductor 14 and dielectric layer 12. As noted above, the conductor 14 can be a contact pad or line.

The dielectric layer 12 can be any dielectric material including inorganic dielectrics or organic dielectrics. The dielectric material can be porous or non-porous. Some examples of suitable dielectrics that can be used as the dielectric material include, but are not limited to: SiN, SiC, SiC (N,H), SiO$_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric can be deposited by PECVD procedures as is generally known in the art.

The conductor 14 can be any suitable conductor including, but not limited to copper (Cu), cobalt (Co), aluminum (Al), ruthenium (Ru), nickel (Ni), iridium (Jr), rhenium (Rh), tungsten, and or combinations including at least one of the aforementioned conductors. In some structures, a copper metal layer can be used and can optionally include an alloying element such as carbon (C), nitrogen (N), oxygen (O), chlorine (Cl) or sulfur(S), which have been shown to improve the reliability of the copper conductor. The amount of alloying element in the copper alloy is typically in the range of about 0.001 weight percent (wt. %) to about 10 wt %).

The conductor 14 can be formed by CVD, sputtering, electrochemical deposition or like processes. For example, the deposition of copper can proceed by electrochemical deposition such as electroplating or electroless plating.

The liner layer 16 can be formed of tantalum (Ta), tantalum nitride (TaN), cobalt (Co), ruthenium (Ru), titanium (Ti), titanium nitride (TiN), tungsten nitride (WN), or combinations thereof. The liner layer 16 can be deposited by PVD, CVD, or ALD processes.

Following formation of the metal layer to define the conductor 14, the semiconductor device 10 is subjected to a planarization process to remove any metal overburden (includes seed layer and liner layer removal) such that a top surface of the conductor 14 is substantially coplanar to the dielectric layer 12 as shown. For example, the surface can be planarized using an electropolishing process. In an electropolishing process, small amounts of metal are etched by electroetch or electrochemical etching to provide a metal interconnect having a top conductor surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

An optional capping layer 18 can be provided on the planarized surface. The capping layer 18 can be formed of silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), silicon oxycarbide (SiOC), hydrogenated silicon carbide, silicon dioxide, organosilicate glass, and other low-k dielectrics or combinations thereof. The capping layer 18 can be utilized to protect the top surface of the conductor as well as to prevent diffusion of the conductor into the dielectric material 20 (see FIG. 2).

Figure 2:
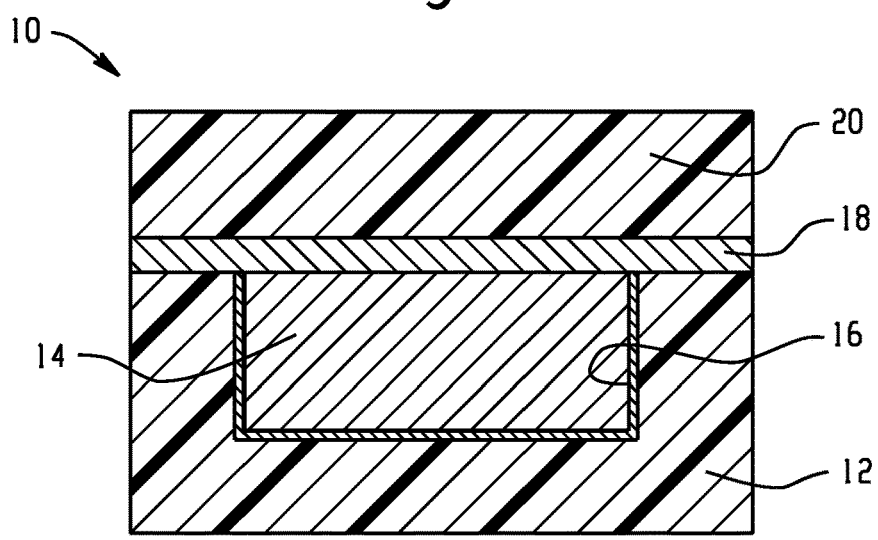
FIG. 2 is schematic cross-sectional view of the semiconductor device of FIG. 1 subsequent to deposition of a first interlayer dielectric layer onto the insulating barrier layer in accordance with one or more embodiments of the present invention.

Referring now to FIG. 2, a dielectric layer 20 is deposited onto the planarized surface or on the capping layer 18, if present. The dielectric layer 20 can be the same or different from dielectric layer 12.

Figure 3:
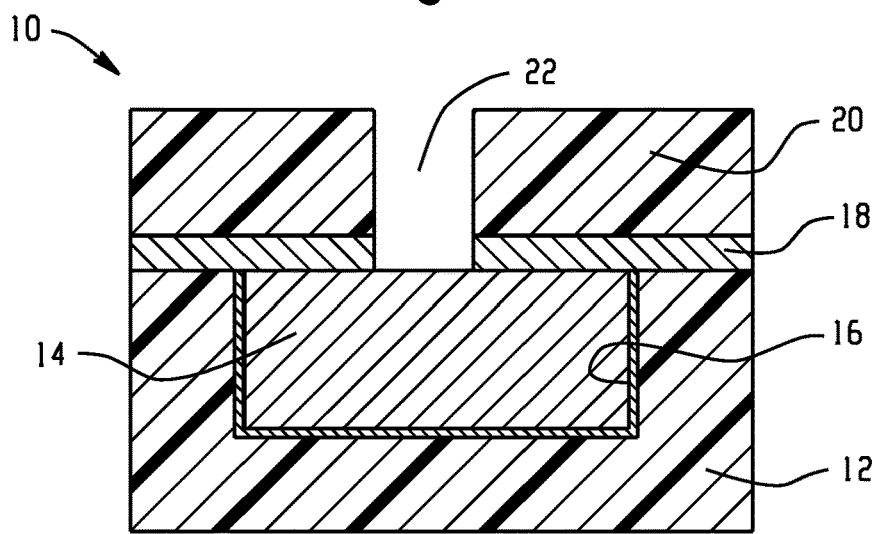
FIG. 3 is a schematic cross-sectional view of the semiconductor device of FIG. 2 subsequent to via opening to the conductor in accordance with one or more embodiments of the present invention.

In FIG. 3, the dielectric layer 20 and the optional capping layer 18 are lithographically patterned and etched to form one or more via openings 22, one of which is shown. Patterning alignment utilizes the conductor 14 such that at least a portion of the conductor 14 is exposed at the bottom of the via opening 22.

The lithographic process for forming the one or more openings in the dielectric 20 generally includes deposition of a photoresist onto the surface. The photoresist is sensitive to radiation, e.g., extreme ultraviolet (EUV) radiation, and, depending on the photoresist used, portions of the photoresist that are exposed to the radiation can be removed (or left remaining) by a development process. The one or more openings 22 are then formed in the dielectric 20 by etching or otherwise modifying the dielectric in the areas from which the photoresist has been removed. For example, a reactive ion etch process can be used to anisotropically remove portions of the interlayer dielectric layer 40 to form the one or more openings.

Figure 4:
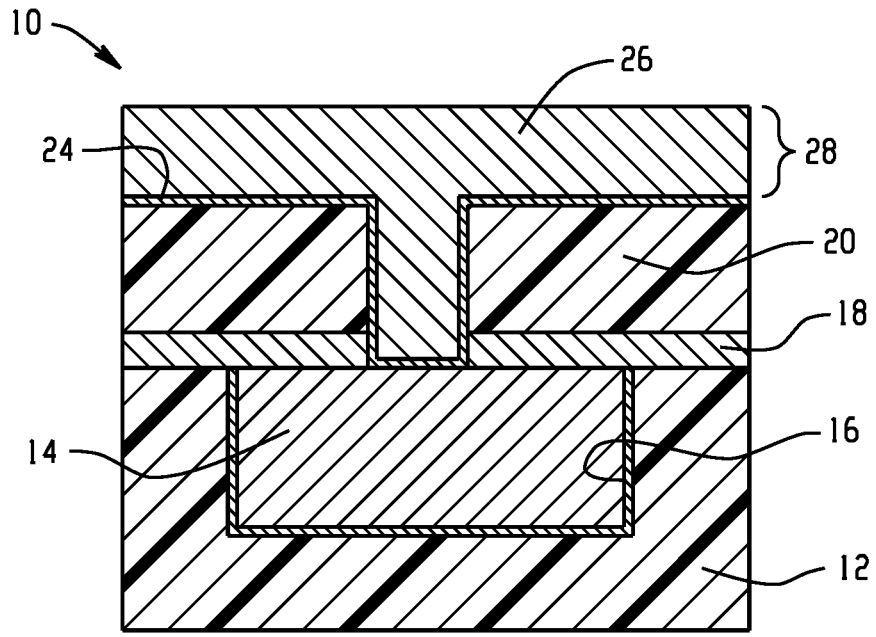
FIG. 4 is a schematic cross-sectional view of the semiconductor device of FIG. 3 subsequent to deposition of a liner layer and metal fill of the via opening in accordance with one or more embodiments of the present invention.

In FIG. 4, a liner layer 24 (i.e., diffusion barrier layer) is conformally deposited onto the patterned interlayer dielectric 40. For example, tantalum, tantalum nitride, cobalt, ruthenium, titanium, titanium nitride, tungsten nitride, and combinations of more than one material (for example tantalum nitride/tantalum or tantalum nitride/cobalt). As previously described, the presence of the liner layer such as titanium nitride, for example, insures that a conductor such copper, which can participate in interdiffusion during subsequent annealing processes, will not further diffuse into dielectric. The liner layer 24 can be deposited by PVD, CVD, or ALD processes.

A bulk conductor 26 is then deposited into the via opening 22 forming a metal overburden 28 on the substrate. The bulk conductor 26 can be the same or different from underlying bulk conductor 14.

Figure 5:
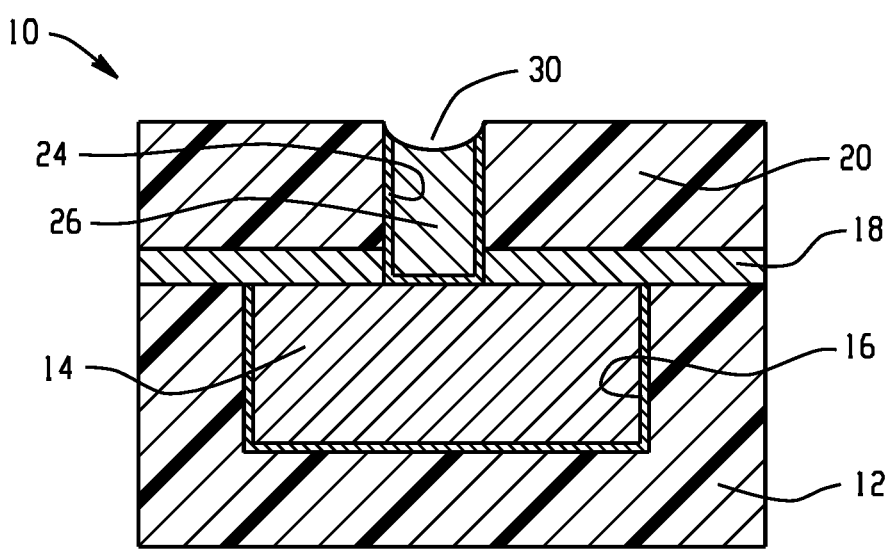
FIG. 5 is a schematic cross-sectional view of the semiconductor device of FIG. 4 subsequent to removal of the metal overburden resulting in a recess formed in the via in accordance with one or more embodiments of the present invention.

In FIG. 5, the semiconductor device 10 is subjected to a planarization process to the liner layer 24 to remove any metal overburden 28 (includes seed layer and liner layer removal). The planarization process is selected to form a recess 30 at a top of the metal filled via 26. The liner layer 24 remaining on the top surface of the dielectric layer 20 is then removed utilizing a planarization process or an etching process selective to the liner layer 24.

Figure 6:
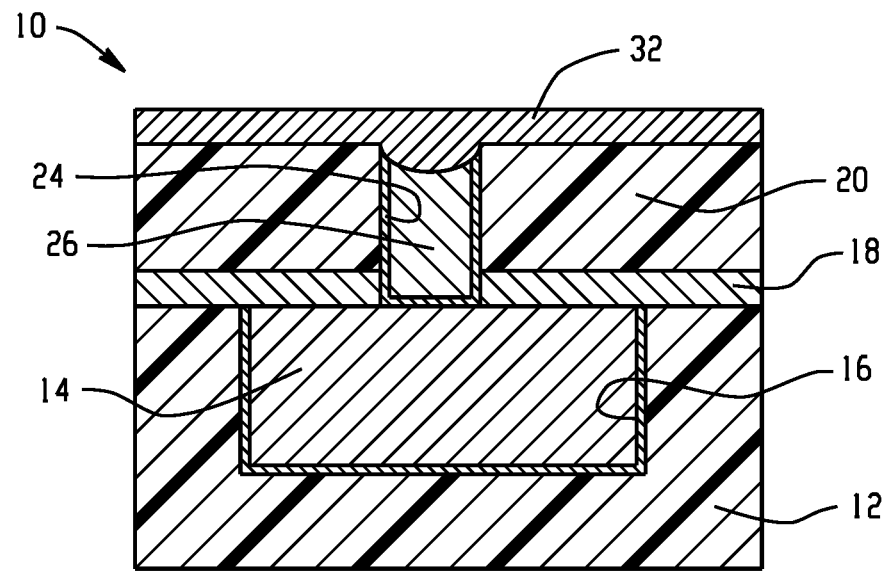
FIG. 6 is a schematic cross-sectional view of the semiconductor device of FIG. 5 subsequent to a deposition of a metal in accordance with one or more embodiments of the present invention.

In FIG. 6, a conductor 32 is deposited onto the semiconductor device 10 filling the recess on conductor 26. The conductor 30 can be a metal including, but not limited to, Ti, Ta, Co, Ru, Ni, Jr, Rh, W, nitrides thereof, and combinations including at least one of the foregoing metals.

Figure 7:
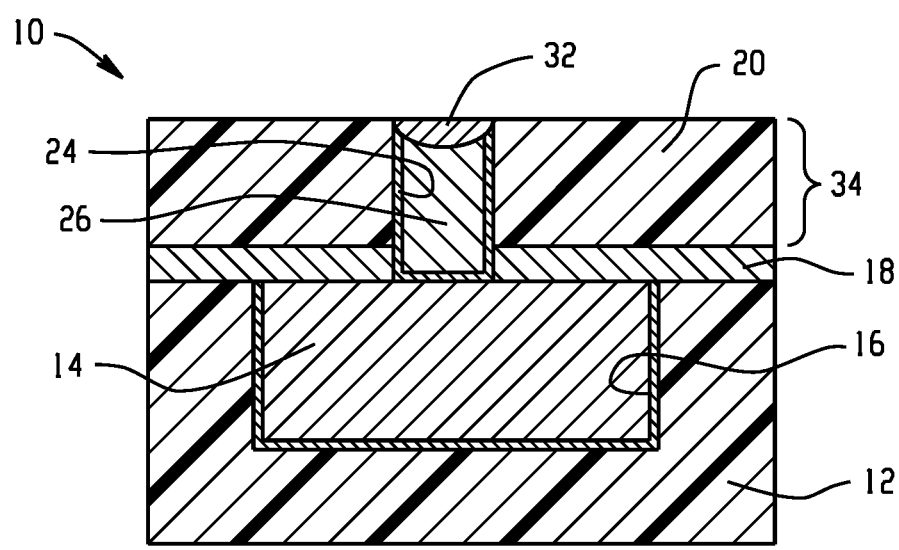
FIG. 7 is a schematic cross-sectional view the semiconductor device of FIG. 5 subsequent to planarization of the metal to the first interlayer dielectric in accordance with one or more embodiments of the present invention.

In FIG. 7, the semiconductor device 10 is subjected to a planarization process to the dielectric layer 20 to define a first node 34. As such, the first node 34 includes the bulk conductor filled via 26 and a metal filled recess 32 at a top portion of the bulk conductor filled via 26.

Figure 8:
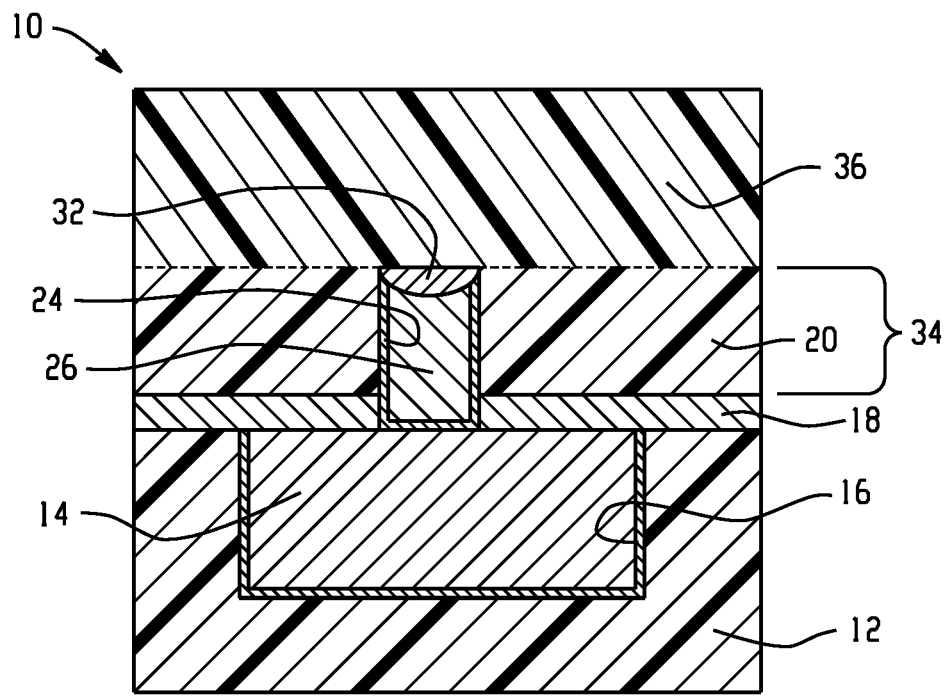
FIG. 8 is a schematic cross-sectional view of the semiconductor device of FIG. 7 subsequent to via opening in the second interlayer dielectric in accordance with one or more embodiments of the present invention.

In FIG. 8, an additional layer 36 of a dielectric material can be deposited onto the structure 10. The additional layer 36 of the dielectric material can be the same or different than the underlying dielectric layer 20.

Figure 9:
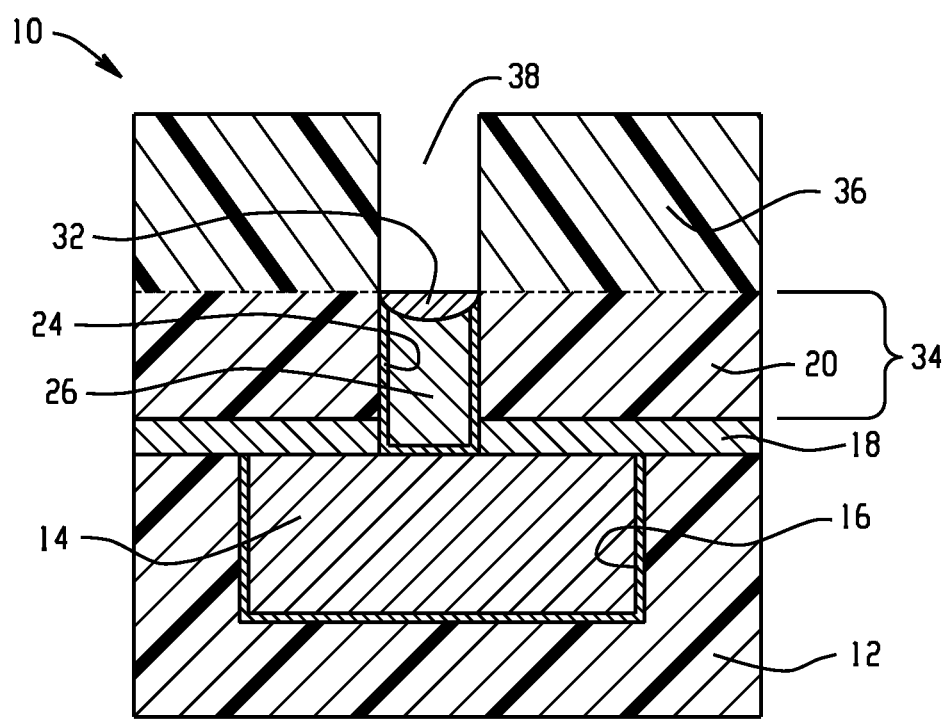
FIG. 9 is a schematic cross-sectional view of the bottom electrode structure of FIG. 8 subsequent to via opening in the second interlayer dielectric and aligned to the conductor or the underlying metal filled via in accordance with one or more embodiments of the present invention.

In FIG. 9, a lithographic process can be utilized to form one or more openings in the additional layer 36 of the dielectric material generally includes deposition of a photoresist onto the surface. The photoresist is sensitive to radiation, e.g., extreme ultraviolet (EUV) radiation, and, depending on the photoresist used, portions of the photoresist that are exposed to the radiation can be removed (or left remaining) by a development process. The one or more openings 38 are then formed in the additional layer 36 of the dielectric material by etching or otherwise modifying the dielectric in the areas from which the photoresist has been removed. For example, a reactive ion etch process can be used to anisotropically remove portions of the interlayer dielectric layer 40 to form the one or more openings. The one or more openings 38 can be aligned with the via 26 using the metal filled recess 32 or the conductor 14.

Figure 10:
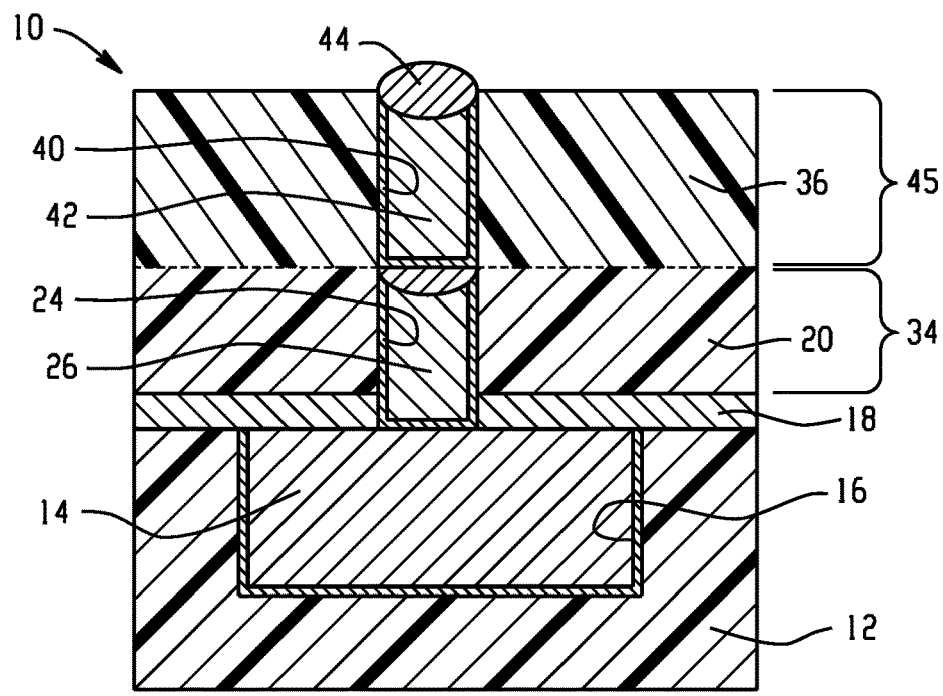
FIG. 10 is a schematic cross-sectional view of the semiconductor device of FIG. 9 subsequent to bulk metal fill and metal recess fill of the via opening in the second interlayer dielectric to form the bamboo tall via interconnect structure including two nodes in accordance with one or more embodiments of the present invention.

In FIG. 10, the process as described above is generally repeated. A liner layer 40 is conformally deposited onto the substrate 10 and into the one or more openings 38 followed by deposition of a bulk metal layer 42 to fill the via. The substrate is then subjected to a planarization process to form a recess that is subsequently filled and further planarized with a metal 44 as previously described to define a second node 45. As such, the second node 34 includes the bulk conductor filled via 42 and a metal filled recess 44 at a top portion of the bulk conductor filled via 42.

The metal 44 can be the same or different from metal 32. However, both metals 32, 44 are different from the bulk conductors 42, 26, 14 and are generally selected to function as a diffusion barrier in addition to its conductivity properties.

Figure 11:
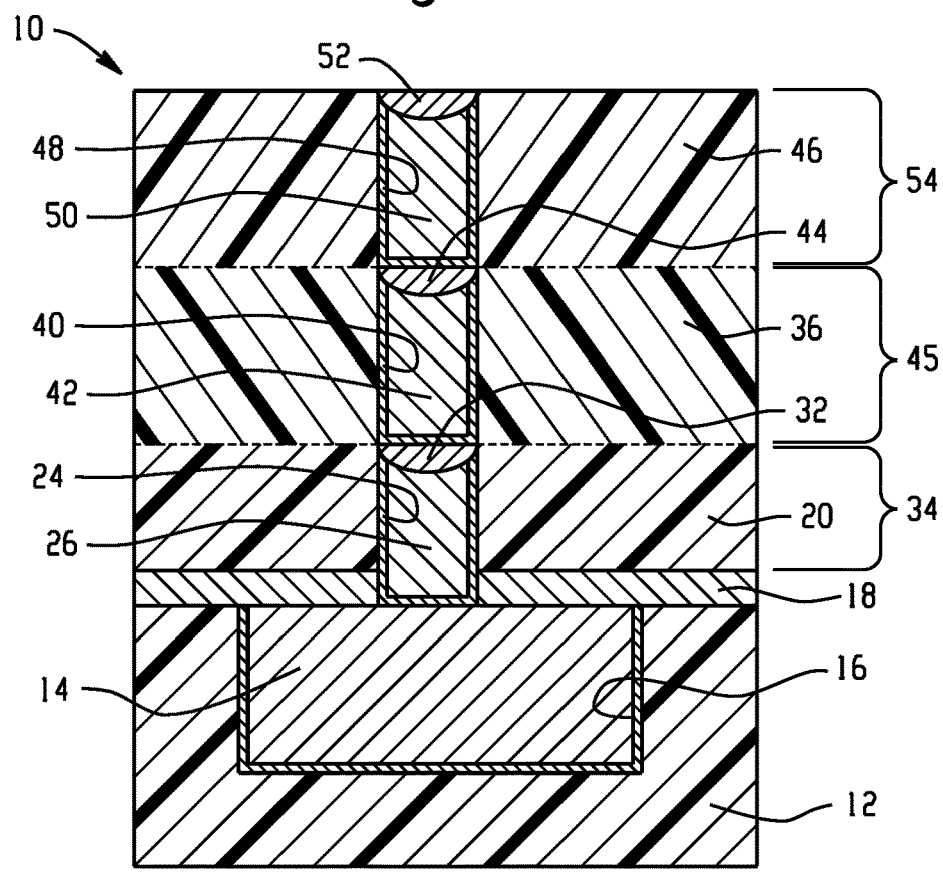
FIG. 11 is a schematic cross-sectional view of the semiconductor device of FIG. 10 subsequent to via opening in a third interlayer dielectric aligned to the underlying metal filled via, bulk metal fill, and metal recess fill of the via opening in the third interlayer dielectric to form the bamboo tall via interconnect structure including three nodes in accordance with one or more embodiments of the invention.

In FIG. 11, the process can be repeated as needed to define an aspect ratio as desired for the intended application. For example, an additional layer 46 of a dielectric material can be deposited onto the structure 10. The additional layer 36 of the dielectric material can be the same or different than the underlying dielectric layer 20. A lithographic process can be utilized to form one or more openings in the additional layer 46 of the dielectric material by etching or otherwise modifying the dielectric in the areas from which the photoresist has been removed. For example, a reactive ion etch process can be used to anisotropically remove portions of the interlayer dielectric layer 40 to form the one or more openings. The one or more openings can be aligned with the underlying via 42 using the metal filled recess 44 or the conductor 14. A liner layer 48 is conformally deposited onto the substrate 10 and into the one or more openings followed by deposition of a bulk metal layer 50 to fill the via. The substrate is then subjected to a planarization process to form a recess that is subsequently filled with a metal 52 as previously described. The metal 52 can be the same or different from metals 32, 44.

The substrate 10 is then subjected to a planarization process to form a recess that is subsequently filled and further planarized with a metal 44 as previously described to define a third node 54. As such, the third node 54 includes the bulk conductor filled via 50 and a metal filled recess 52 at a top portion of the bulk conductor filled via 50.

Figure 12:
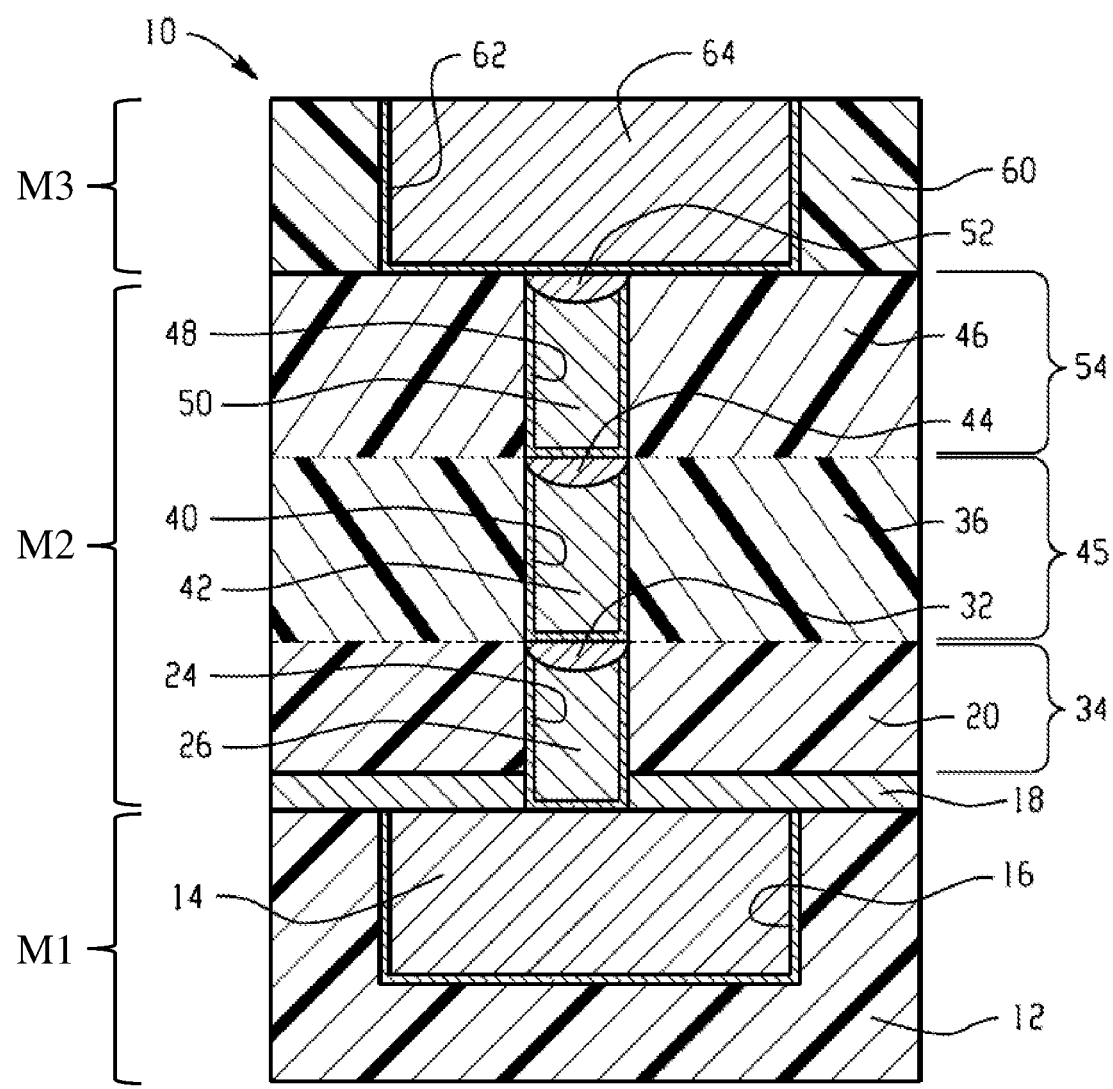
FIG. 12 is a schematic cross-sectional view of the bamboo tall via interconnect structure of FIG. 11 subsequent to formation of an interconnect or memory stack electrically coupled to the bamboo tall via interconnect structure in accordance with one or more embodiments of the invention.

Referring now to FIG. 12, there is depicted the bamboo tall via interconnect structure subsequent to deposition of a dielectric layer 60 followed by patterning and formation of a contact pad or line or a memory stack, shown generally at reference numeral 64 including liner layer 62 as can be desired for the intended semiconductor device. An alternate process is to form a contact pad or line or a memory stack, shown generally at reference numeral 64 first by subtractive patterning followed by dielectric layer 60 deposition and CMP.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A process for forming a bamboo tall via interconnect structure, the process comprising:
    forming a first node comprising:
        forming a via opening in a first dielectric layer overlying a substrate, wherein the via opening exposes a surface of an underlying conductor of a first metallization layer (M1);
        conformally depositing a liner layer in the via opening;
        depositing a bulk conductor in the via opening,
        recessing a surface of the bulk conductor within the via opening;
        depositing a conductive metal onto the recessed surface of the bulk conductor; and
        planarizing the conductive metal to a surface of the first dielectric layer; and
    forming a second node stackedly arranged and in alignment with the first node, wherein forming the second node comprises:
        forming a second via opening in a second dielectric layer deposited onto the first node, wherein the second via opening exposes the conductive metal in the recess;
        conformally depositing a second liner layer in the second via opening;
        depositing a second bulk conductor in the second via opening;
        recessing a surface of the second bulk conductor within the second via opening;
        depositing a second conductive metal onto the recessed surface of the second bulk conductor; and
        planarizing the second conductive metal to a surface of the second dielectric layer; and
    forming a third node stackedly arranged and in alignment with the first node and the second node;
    wherein the first node, the second node, and the third node together define a skip via that directly connects M1 to a third metallization layer (M3), wherein a second metallization layer (M2) is between M1 and M3.

2. The process of claim 1 further comprising electrically coupling the third node to a memory stack.

3. The process of claim 1, wherein the liner layers in the first node, the second node, and the third node comprise tantalum (Ta), tantalum nitride (TaN), cobalt (Co), ruthenium (Ru), titanium (Ti), titanium nitride (TiN), tungsten nitride (WN), or combinations thereof.

4. The process of claim 1, wherein the bulk conductors in the first node, the second node, and the third node comprise copper (Cu), cobalt (Co), aluminum (Al), ruthenium (Ru), nickel (Ni), iridium (Ir), rhenium (Rh), tungsten, and or combinations thereof.

5. The process of claim 1, wherein the conductive metal in the recesses in the first node, the second node, and the third node comprises titanium, tantalum, cobalt, ruthenium, nickel, iridium, rhenium, tungsten, nitrides thereof, or combinations including at least one of the foregoing metals.

6. The process of claim 1, wherein forming the second via opening comprises utilizing the conductive metal in the recess of the first node as an alignment marker.

\* \* \* \* \*